United States Patent
Ventzek et al.

(10) Patent No.: US 11,521,834 B2
(45) Date of Patent: Dec. 6, 2022

(54) PLASMA PROCESSING SYSTEMS AND METHODS FOR CHEMICAL PROCESSING A SUBSTRATE

(71) Applicant: Tokyo Electron Limited, Tokyo (JP)

(72) Inventors: Peter Ventzek, Austin, TX (US); Alok Ranjan, Austin, TX (US); Mitsunori Ohata, Taiwa-cho (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 17/003,734

(22) Filed: Aug. 26, 2020

(65) Prior Publication Data

US 2022/0068601 A1  Mar. 3, 2022

(51) Int. Cl.
*H01J 37/32* (2006.01)

(52) U.S. Cl.
CPC ........ *H01J 37/3244* (2013.01); *H01J 37/321* (2013.01); *H01J 37/32357* (2013.01); *H01J 37/32541* (2013.01); *H01J 37/32568* (2013.01); *H01J 37/32715* (2013.01)

(58) Field of Classification Search
CPC ............. H01J 37/32119; H01J 37/3244; H01J 37/32082; H01J 37/32577; H01J 37/32174
See application file for complete search history.

(56) References Cited

U.S. PATENT DOCUMENTS

| | | | |
|---|---|---|---|
| 7,732,010 B2* | 6/2010 | Choi | H01J 37/32082 156/391 |
| 11,001,926 B2* | 5/2021 | Mann | H01J 37/321 |
| 2008/0295872 A1* | 12/2008 | Riker | H01L 21/67207 34/174 |
| 2009/0008035 A1* | 1/2009 | Iwai | H01J 37/32082 156/345.47 |
| 2011/0006038 A1 | 1/2011 | Kutney et al. | |
| 2011/0303365 A1 | 12/2011 | Yamamoto et al. | |

(Continued)

FOREIGN PATENT DOCUMENTS

| | | |
|---|---|---|
| JP | 2011066033 A | 3/2011 |
| WO | 2020055612 A1 | 3/2020 |

OTHER PUBLICATIONS

Lee, C. et al., "Global model of Ar, O2, Cl2, and Ar/O2 high-density plasma discharges," Journal of Vacuum Society Technology, A 13(2), Mar./Apr. 1995, 13 pages.

(Continued)

*Primary Examiner* — Tung X Le
(74) *Attorney, Agent, or Firm* — Slater Matsil, LLP

(57) ABSTRACT

A plasma processing system includes a radical source chamber including a gas inlet, an electrode coupled to a radio frequency (RF) power source, where the electrode is configured to generate radicals within the radical source chamber, and an exit for radicals generated within the radical source chamber; a plenum attached to the exit of the radical source chamber, where the plenum is made of a first thermal conductor, and where the walls of the plenum include openings for gas flow; and a process chamber connected to the radical source chamber through the plenum. The process chamber includes a substrate holder disposed below the plenum; a gas outlet below the substrate holder; and process chamber walls including a second thermal conductor, where the process chamber walls of the process chamber are thermally coupled to the walls of the plenum.

20 Claims, 5 Drawing Sheets

(56) References Cited

U.S. PATENT DOCUMENTS

| | | | |
|---|---|---|---|
| 2014/0174362 A1 | 6/2014 | Kao et al. | |
| 2014/0190635 A1* | 7/2014 | Lee | H01J 37/32357 156/345.48 |
| 2015/0136325 A1* | 5/2015 | Ye | H01J 37/32091 156/345.28 |
| 2018/0174870 A1 | 6/2018 | Yang et al. | |
| 2021/0050213 A1* | 2/2021 | Savas | H01L 21/02315 |
| 2021/0249239 A1* | 8/2021 | Apurva | H01J 37/3244 |

OTHER PUBLICATIONS

Lee, C., et al., "Role of Etch Products in Polysilicon Etching in a High-Density Chlorine Discharge," Plasma Chemistry and Plasma Processing, vol. 16, No. 1, 1996, 22 pages.

Livesey, R.G., "Solution methods for gas flow in ducts through the whole pressure regime," Science Direct, Vacuum Surface Engineering, Surface Instrumentation & Vacuum Technology, Vacuum 76 (2004), May 6, 2004, 7 pages.

Roth, A., "Vacuum Technology," Second revised edition, North Holland Publishing Company, 1982, 34 pages.

Shinagawa, Hideo et al., "An experimental and theoretical investigation of rarefied gas flow through circular tube of finite length," Chemical Engineering Science 57, 2002, 10 pages.

Varoutis, S., et al., "Rarefied gas flow through short tubes into vacuum," Journal of Vacuum Society Technology, A 26(2), Mar./Apr. 2008, 11 pages.

Varoutis, S., et al., "Simulation of gas flow through tubes of finite length over the whole range of rarefaction for various pressure drop ratios," Journal of Vacuum Society Technology, A 27(6), Nov./Dec. 2009, 15 pages.

PCT International Search Report and Written Opinion, PCT Application No. PCT/US2021/046224, dated Nov. 29, 2021, 9 pages.

* cited by examiner

PLASMA PROCESSING SYSTEMS AND METHODS FOR CHEMICAL PROCESSING A SUBSTRATE

TECHNICAL FIELD

The present invention relates generally to a systems and methods for processing of a substrate, and, in particular embodiments, to a plasma processing systems and methods for chemical processing a substrate.

BACKGROUND

Generally, a semiconductor device, such as an integrated circuit (IC) is fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias) integrated in a monolithic structure. Many of the deposition and etch steps used to form the constituent structures of semiconductor devices comprise plasma-assisted processing. Plasma processing techniques include chemical dry etching (CDE) (e.g., plasma ashing), physical or sputter etching, a combination of physical and chemical dry etching (e.g., reactive ion etching (RIE)), and plasma-enhanced CVD (PECVD), plasma-enhanced atomic layer etch (PEALE), and plasma-enhanced atomic layer deposition (PEALD).

At each successive technology node, the minimum feature sizes are shrunk to reduce cost by roughly doubling the component packing density. The demand for low cost electronics with high functionality has driven feature sizes down to a few nanometers, intensifying the challenges in semiconductor fabrication technology. In particular, plasma processing technology needs to fabricate nanostructures with dimensions often precisely controlled at an atomic scale, uniformly across a wide (e.g., 300 mm) wafer. Further innovations in plasma equipment and process design may have to be made to meet the stringent demands of precision, uniformity, stability, and repeatability in manufacturing scaled semiconductor devices.

SUMMARY

A plasma processing system includes a radical source chamber including a gas inlet, an electrode coupled to a radio frequency (RF) power source, where the electrode is configured to generate radicals within the radical source chamber, and an exit for radicals generated within the radical source chamber; a plenum attached to the exit of the radical source chamber, where the plenum is made of a first thermal conductor, and where the walls of the plenum include openings for gas flow; and a process chamber connected to the radical source chamber through the plenum. The process chamber includes a substrate holder disposed below the plenum; a gas outlet below the substrate holder; and process chamber walls including a second thermal conductor, where the process chamber walls of the process chamber are thermally coupled to the walls of the plenum.

A plasma processing system includes a plenum including a bottom wall, a sidewall around the edge of the bottom wall, a rim extending outwards beyond the sidewall, and a radical ballast region between the sidewall and the bottom wall. The plenum is a thermally conductive structure. The system further includes a radical source chamber including a gas inlet, a radio frequency (RF) electrode, and a bottom exit attached to the rim of the plenum; a process chamber including thermally conductive walls that are physically attached to the plenum at the rim, where the plenum includes openings connecting the process chamber to the radical source chamber through the radical ballast region; and a substrate holder disposed below the bottom wall of the plenum.

A plasma processing method includes loading a substrate on a substrate holder disposed near the bottom of a process chamber; via a gas inlet, introducing process gas and carrier gas into a radical source chamber, the radical source chamber including an exit attached to a plenum disposed below the radical source chamber; sustaining a plasma in a radical source chamber, the plasma including radicals; transporting the radicals to the substrate in a gas flow through openings in the walls of the plenum; chemically processing a surface of the substrate with the radicals; and removing excess reactants and gaseous byproducts from the process chamber via a gas outlet disposed below the substrate holder.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
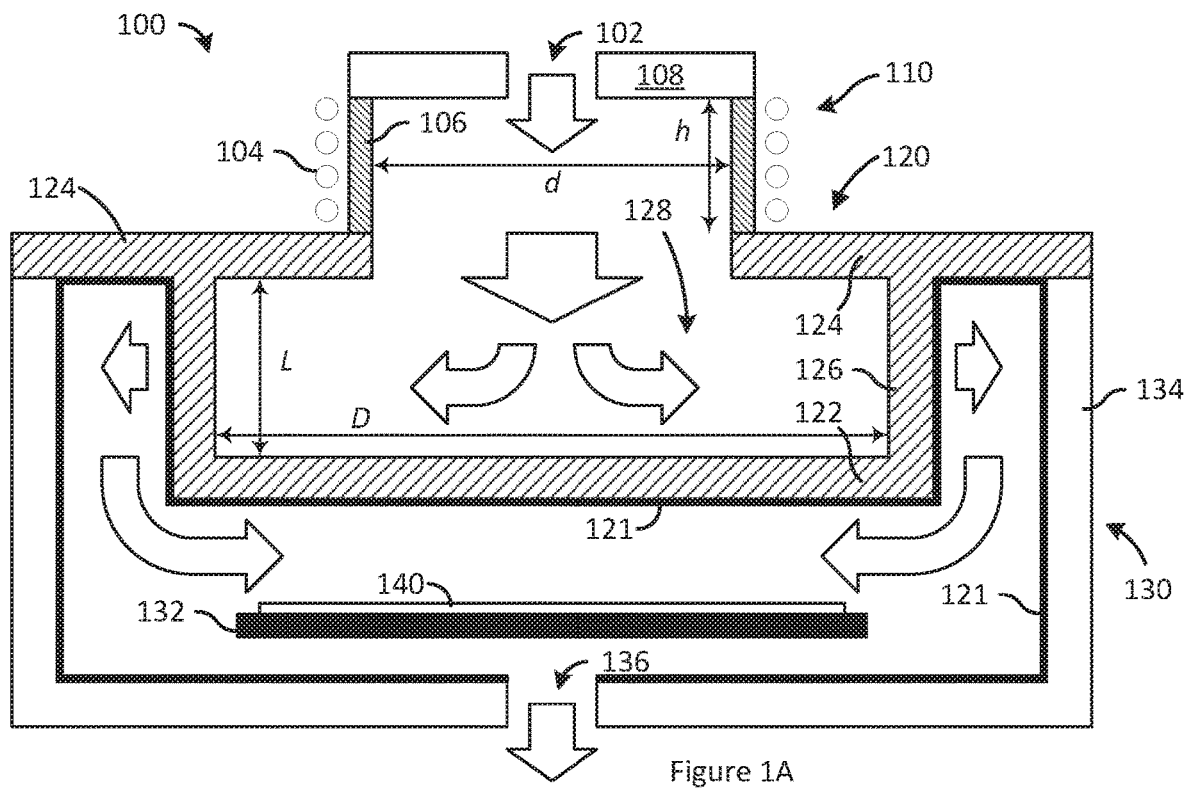
FIG. 1A illustrates a cross-sectional view of a plasma system for chemically processing a surface of a substrate, in accordance with an embodiment.

This disclosure describes embodiments of a plasma system and method for chemically processing a surface of a substrate at a relatively low substrate temperature by exposing the substrate to gaseous reactants comprising radicals extracted from a plasma radical source. The plasma processing techniques for which the disclosed plasma system may be used do not expose the surface directly to plasma. In these techniques, the substrate is processed by performing chemical reactions using energetic radicals that have been extracted from plasma located away from the substrate and then transported in a gas flow over the surface of the substrate for chemical processing. The embodiments described in this disclosure provide several advantages: efficient radical transport, low plasma-induced radiation damage, and stable processing environment achieved by equipment design for efficient heat dissipation, as explained in detail further below.

Chemical processing of the surface at a relatively low substrate temperature is often performed by exposing the surface to a gas comprising high energy radicals present in a relatively high ratio of radicals to ions. Generally, an indirect plasma system is preferred for chemical processing in order to reduce physical damage to the substrate from ion bombardment and to reduce plasma-induced radiation damage from high energy electromagnetic radiation (e.g., ultraviolet radiation) generated in a plasma discharge. Typically, indirect plasma systems have three sections: a first section comprising a radical source that is physically separated from the substrate, a second section through which the radicals may be transported in a gas flow, and a third section interfacing with the second section, in which the substrate may be loaded on a substrate holder, its surface chemically processed with the radicals, and the excess reactants and gaseous byproducts removed via a gas outlet.

In the indirect plasma systems described in this disclosure, the first section, referred to as the radical source chamber, may be configured to sustain plasma; the second section, referred to as the plenum, comprises a radical ballast region; the third section, referred to as the process chamber, may be connected to the radical source chamber through the plenum for the substrate to be accessible to radicals for chemical processing. The example embodiments in this disclosure may provide an enhanced radical flux to ion flux ratio in the gas flow by using a radio frequency (RF) electrode configured to sustain purely inductively coupled plasma in the radical source chamber. The embodiments described with reference to FIG. 1A through FIG. 3B use a helical resonator as the RF electrode of the radical source chamber, whereas a planar coil has been used in the example embodiment illustrated in FIG. 4. Radical loss during transport has been reduced by using an adjacent plasma design instead of using a remote plasma design. In the adjacent plasma design of the example embodiments, only a short radical ballast region separates the radical source chamber from the process chamber. Plasma-induced damage has been reduced not only by physically separating the plasma from the substrate in the process chamber by interposing the plenum in between but also by configuring the plenum walls to block ultraviolet radiation in a direct line of sight from the radical source chamber to the substrate holder using a material opaque to ultraviolet radiation. Instability in the processing environment has been reduced by designing the material and geometry of the plenum for efficient heat dissipation; thereby help maintain a stable low temperature during processing. Furthermore, the expansion and contraction of surfaces with temperature transients during processing may cause flaking of deposits, thereby generating unwanted particles inside the process chamber.

Figure 1B:
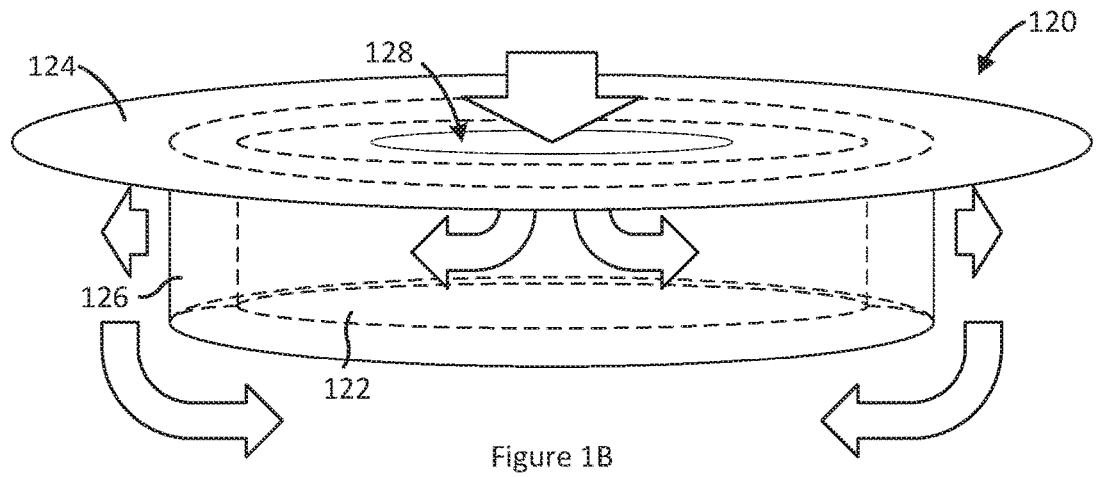
FIG. 1B illustrates a perspective view of a section of the plasma system illustrated in cross-sectional view in FIG. 1A, in accordance with an embodiment
Figure 1C:
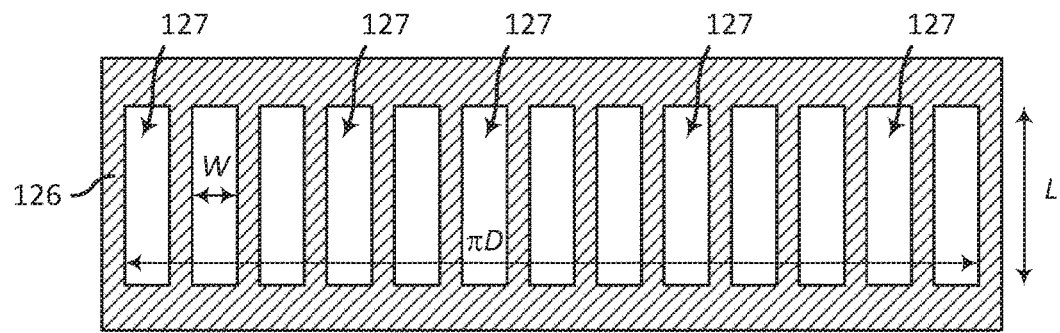
FIG. 1C illustrates a side view of the section of the plasma system illustrated in perspective view in FIG. 1A, in accordance with an embodiment.

The location of openings for gas flow through the walls of the plenum may be designed in a configuration that directs the gas entering the process chamber through the walls of the plenum to flow in a desired pattern over the surface of the substrate loaded on a substrate holder in the process chamber. FIGS. 1A-1C illustrate an embodiment of an indirect plasma system 100 where the gas flow is directed laterally from the periphery of the substrate. In an embodiment illustrated in FIGS. 2A-2B, the gas flow in the plasma system 200 is directed vertically from the top, and in another embodiment of the plasma system 300 illustrated in FIGS. 3A-3B, the gas is directed from one side to generate a cross flow over the substrate.

Referring now to FIG. 1A, the plasma system 100 comprises a radical source chamber 110, a plenum 120 attached to an exit of the radical source chamber 110, and a process chamber 130 connected to the radical source chamber 110 through the plenum 120.

The radical source chamber 110 of the plasma system 100 may be shaped like an inverted open cylinder having a gas inlet 102 in a top cover 108 and a radio frequency (RF) electrode 104 disposed outside a sidewall 106. The RF electrode 104 may be a conductive helix coiled vertically around the sidewall 106 comprising a dielectric (e.g., a ceramic material). The top cover may comprise a conductive material with a dielectric coating on the side facing the inside of the radical source chamber 110, for example, aluminum coated with alumina or yttria. Various gases (e.g., argon, oxygen, sulfur hexafluoride, and tetrafluoromethane, nitrogen trifluoride, and the like) may be introduced in the chamber to form controlled gas discharge plasma as a source of radicals.

The electrode 104 is coupled to an RF power source (not shown). The length of the conductor may be designed to be quarter wavelength ($\lambda/4$) or half-wavelength ($\lambda/2$) of an RF electromagnetic oscillation in the electrode powered by the RF power source. In various embodiments, the oscillation frequency, f, may be about 15 MHz to about 500 MHz and, in one embodiment about 15 MHz to about 200 MHz. The electrode 104 may be configured to operate in a purely inductively coupled mode to sustain plasma with an RF power density of about 0.01 W/cm$^3$ to about 1 W/cm$^3$ within the radical source chamber 110.

In the example embodiments in this disclosure, the radical source chamber 110 of width, d, has an open bottom for the radicals to be transported in a gas flow exiting the radical source chamber 110 to a radical ballast region 128 of the plenum 120 attached at the exit, as illustrated in FIG. 1A. The plenum 120 comprises a bottom wall 122, a sidewall 126 around the edge of the bottom wall 122, a rim 124 extending outwards beyond the sidewall, and a radical ballast region 128 between the sidewall 126 and the bottom wall 122. The plenum 120 may be shaped like an inverted hat with a ring shaped rim 124 having a central opening leading to the radical ballast region 128 bounded by the sidewall 126 and the bottom wall 122, as seen in the perspective view in FIG. 113. The width of the central opening of the rim 124 is designed to be less than or equal to the width, d, of the radical source chamber 110. (In FIG. 1A, the width of the opening of the rim 124 is shown equal to d by example only.) This allows the bottom exit of the radical source chamber 110 to be physically attached to the rim 124 of the plenum 120, as illustrated in FIG. 1A. The radicals may thus use the central opening of the rim 124 to exit the radical source chamber 110 and enter the radical ballast region 128.

Also attached to the rim 124 is the process chamber 130 disposed below the rim 124, as illustrated in FIG. 1A. In the embodiments described in this disclosure such as the plasma system 100 in FIG. 1A, the rim 124 is extending outwards from the sidewall 126 covering the top of the process chamber 130 and is attached to the vertical section of the walls 134 of the process chamber 130. In various other embodiments, the rim 124 may extend a part of the way to the edge of the process chamber 130 and attach to a top cover of the process chamber 130, or the rim 124 and the walls 134 may be one monolithic structure.

The process chamber 130, illustrated in FIG. 1A, comprises an annular region adjacent to the sidewall 126 and extends further below into a cylindrical region adjacent to the bottom wall 122. A substrate holder 132 may be disposed in the region adjacent below the bottom wall 122 of the plenum. A substrate 140 is shown loaded on the substrate holder 132. A gas outlet 136 may be disposed below the substrate holder 132 via which excess reactants and gaseous byproducts may be removed from the process chamber 130. The process chamber design that has been used is common to all the embodiments in this disclosure, except the gas outlet 136 may be placed asymmetrically in embodiments such as plasma system 300 (see FIG. 3A) in order to facilitate generation of a desired asymmetric gas flow pattern over the substrate holder 132. While each of the example plasma systems in this disclosure shows a single gas inlet and a single gas outlet, it is understood that multiple gas inlets and multiple gas outlets may also be used.

One aspect of the design of the plasma systems described in this disclosure is efficient heat dissipation. For that purpose, the walls of the plenum 120, such as the bottom wall 122, the rim 124, and the sidewall 126, and walls 134 of the process chamber 130 comprise thermally conductive material such as aluminum, or copper, or the like, and are coupled together both physically and thermally. As known to a person skilled in the art, various electrically conductive walls of a plasma system such as plasma system 100 may be electrically connected to the system ground (the reference potential). In plasma system 100, heat may be generated by positively charged energetic ions in the gas flow undergoing inelastic collisions with the grounded walls of the plenum 120, thereby imparting their energy to the walls as heat. Random collisions of energetic radicals with the walls around the radical ballast region 128 also contribute to the heat generation. Rapid removal of the generated heat may be facilitated not only by using materials with high thermal conductivity but also by reducing the number of connections between parts in the mechanical design of the structure. Thermal contact of a metal joint may be degraded by gaps developing in grooves over time because of mechanical stress, for example, in suspended parts connected by joints such as lap joints, T-joints, or corner joints.

In addition to using thermally conductive material, the inverted hat structure of the plenum 120, illustrated in FIG. 1B, may be designed as a monolithic structure to reduce the thermal resistance to achieve efficient heat flow to the process chamber walls 134. In one embodiment, the plenum 120 and the process chamber walls 134 could be formed together as a monolithic structure, for example, by casting or some other metal forming processes.

The process chamber walls 134 may have the thermal capacity to act as a heat sink, or may be connected thermally to an external heat sink. As explained above, the efficient heat removal provides the advantage of helping maintain a stable processing environment. Conditioning the walls 134 of the process chamber 130 and the walls of the plenum 120 that are facing the adjacent process chamber, and/or covering the surface with a thin layer of material such as alumina or yttria also help stabilize the processing environment.

A cover layer 121, illustrated in FIG. 1A, may be provided by using various techniques, for example, using anodized aluminum, coating with yttria, or conditioning the process chamber 130. The cover layer 121 may comprise one material for the walls of the plenum 120 and a different material for the walls 134 of the process chamber 130. Generally, the chemical state of the walls of a plasma process chamber is altered during processing by ion bombardment, and chemical reaction with various radicals and gaseous byproducts. The cover layer 121 provides an additional advantage of reducing such variability of the chemical state of the walls; hence further stabilizing the plasma processing environment.

The process chamber 130 is connected to the radical source chamber 110 through the radical ballast region 128 of the plenum 120. The width, D, of the radical ballast region 128 is greater than or equal to the width of the opening in the rim 124, which has been designed to also be the exit for radicals, as explained above. Accordingly, in the embodiments described in this disclosure, the radicals extracted from plasma in the radical source chamber 110 may be transported to the substrate 140 in a gas flow exclusively through openings in the walls of the plenum. Thus, the configuration of the openings in the design of the plenum 120 may be used for directing the gas flow through the plenum 120 and in the process chamber 130 in a desired pattern. In the embodiments illustrated in FIGS. 1A-4, the width, D, of the radical ballast regions 128 and 328 are also greater than or equal to the width of the respective substrate holder 132.

In FIG. 1A, the width of the central opening in the rim 124, is shown to be equal to the width, d, of the radical source chamber 110. However, it is understood that the width of the central opening in the rim 124 may be smaller, for example, in a design where the rim 124 extends further inwards to constrict the opening connecting the radical source chamber 110 to the radical ballast region 128.

In FIG. 1A, a gas flow between the gas inlet 102 and the gas outlet 136 is shown to be streaming through a channel comprising three contiguous sections: the radical source chamber 110, the plenum 120, and the process chamber 130, as indicated by block arrows in FIG. 1A. A gas flow system (not shown) comprising a vacuum pump connected at the gas outlet 136 may be used to create a controlled pressure gradient to maintain a steady gas flow. In the plasma system 100, the gas flow over the substrate holder 132 (and the substrate 140) has been directed radially inwards from the periphery of the process chamber. The configuration of various openings in the design of the plasma system 100 has been used to route the flow, as understood with reference to FIGS. 1A-1C.

A gaseous mixture, for example, a mixture of oxygen and argon may be introduced through the gas inlet 102 located in the top cover 108 of the radical source chamber 110. The gas may be ionized and plasma comprising oxygen radicals may be sustained inside the radical source chamber 110 using electromagnetic energy from an electrode 104 coupled to an RF power source. In the plasma system 100, electrode 104 is a helical resonator disposed outside a ceramic sidewall 106 and inductively coupled to the plasma. The dimensions of the radical source chamber 110 are designed to ignite and confine the gas discharge plasma within the designated volume of the radical source chamber 110. For example, the height, h, of the radical source chamber and the width, d, are at least a few skin depths. In various embodiments, h is about 5 cm to about 20 cm, and d is about 10 cm to about 20 cm.

The radicals (e.g., oxygen radicals) may be transported in a gas flow out of the radical source chamber 110 through the bottom exit to the radical ballast region 128 of the plenum 120. As shown in the perspective view in FIG. 1B, the radical ballast region 128 is the cavity of the inverted hat shaped plenum 120. The radical ballast region has a cylindrical shape of width, D, and depth, L. In the plasma system 100, a solid bottom wall 122 (with no openings) blocks the vertical flow, thereby directing the gas to flow radially outwards to the vertical sidewall 126 of the cylindrical radical ballast region 128, as indicated by the block arrows in FIGS. 1A and 1B. The openings for gas flow out of the plenum 120 into the process chamber 130 are located symmetrically in the sidewall 126 of the radical ballast region 128. Routing the gas radially outwards towards the walls 134 of the process chamber assists in increasing the radical to ion ratio in the gas. The increased surface area to volume ratio of the annular region around the ballast region 128 results in more collisions with the walls 134 of the process chamber. In a collision with the walls 134, the sticking coefficient for ions is higher than that for radicals. Hence, the higher collision rate raises the radical to ion ratio. The substrate holder 132 and the substrate 140 are disposed directly below the plenum 120 and the gas outlet 136 is located directly below the substrate holder 132. This configuration makes the structure roughly axisymmetric around an axis normal to the surface of the substrate 140, generating an azimuthally symmetric flow of gas over the substrate 140.

FIG. 1C illustrates a side view of the sidewall 126 having rectangular openings 127 of width, W, and a length roughly equal to the depth, L, of the plenum 120. The sidewall 126, being disposed along the edge of the circular bottom wall 122, has the length, πD, of the circumference. The design for the dimensions of the radical ballast region 128 and the openings 127 in the sidewall 126 consider the requirements for both gas flow and heat flow out of the plenum. A smaller W and L restrict the gas flow but improve the heat flow out of the plenum.

The dimensions of the radical ballast region 128 may be designed to allow for the gas to attain a roughly stable and uniform density prior to entering the process chamber 130 and also provide sufficient pressure gradient to prevent back flow into the radical source chamber 110. Generally, the depth, L, is a few diffusion lengths, and the respective width, D, is designed for a desired pressure gradient and volumetric flow rate. The known relationships between volumetric flow rate, pressure gradient and the geometrical parameters of conduits of various shapes may be utilized in the design of the radical ballast region. The radical ballast region 128 in the embodiment illustrated in FIG. 1C has a cylindrical shape. In other embodiments the radical ballast region may have a different shape. For example, the radical ballast region 328 in FIGS. 3A and 3B have a rectangular shape. In various embodiments, the depth, L, may be about 5 cm to about 15 cm, and a ratio, D/L may be about 3 to about 10. In various embodiments, the width, W, of the rectangular openings 127 may be about 0.1 cm to about 5 cm. The pressure in the process chamber 130 may be constrained by the process recipe specifications and may be about 0.01 Torr to about 0.25 Torr in various embodiments. In order to help increase the radical to ion ratio, prevent undesired sputtering, and prevent backflow, the pressure inside the radical source chamber 110 is relatively high; typically double that for choked flow condition in the plenum 120. In various embodiments, the pressure inside the radical source chamber 110 may be about 0.5 Torr to about 1 Torr.

The solid bottom wall 122 of the plenum 120 in the plasma system 100 may provide an additional advantage of blocking damaging electromagnetic radiation, for example, ultraviolet radiation, from reaching the substrate. As mentioned above and illustrated in FIG. 1A, the width, D, of the plenum 120, which is also the width of the bottom wall 122, may be designed to be greater than the width of the substrate holder 132 (and the substrate 140) and also greater than the width of the radical source chamber 110, in which the plasma may be confined. As also mentioned above, the walls of the plenum (which includes the bottom wall 122) may comprise metals, such as aluminum and copper. As known to a person skilled in the art, metals such as aluminum and copper are, for all practical purposes, opaque to electromagnetic radiation because of the very high free electron density in these materials. Accordingly, in the design of the plasma system 100, the dimensions may be adjusted such that the bottom wall 122 is in the line of sight between the plasma and the substrate; hence the substrate 140 may be shielded adequately from plasma-induced radiation damage.

Figure 2A:
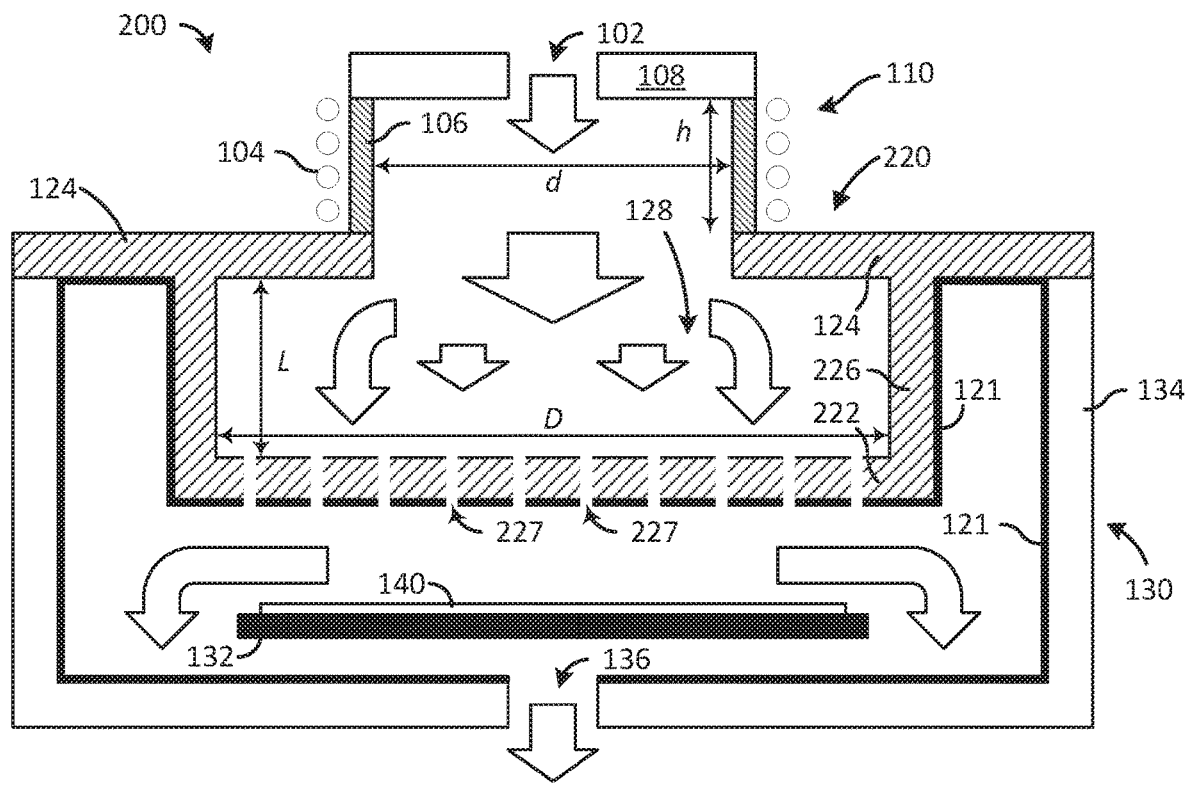
FIG. 2A illustrates a cross-sectional view of a plasma system for chemically processing a surface of a substrate, in accordance with an embodiment.
Figure 2B:
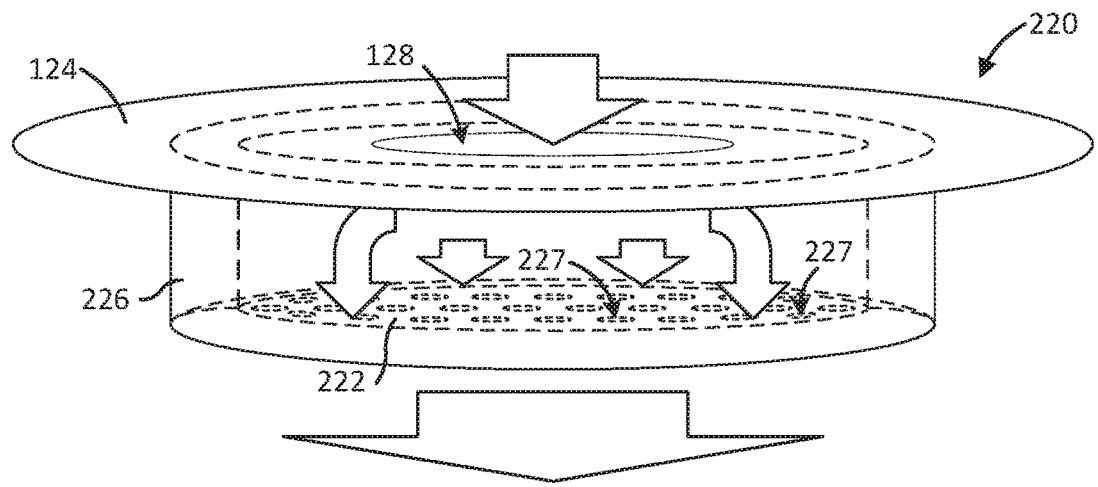
FIG. 2B illustrates a perspective view of a section of the plasma system illustrated in cross-sectional view in FIG. 1A, in accordance with an embodiment.

FIGS. 2A and 2B illustrate a plasma system 200. One difference between the plasma system wo and the plasma system 200 is that, in plasma system 200, the gas flow through the plenum 220 into the process chamber 130 is directed vertically through openings 227 in a bottom wall 222 of the plenum 220, as indicated by the block arrows in FIGS. 2A and 2B. As illustrated in FIGS. 2A and 2B, the openings 227 for gas flow are configured symmetrically around an axis normal to the substrate holder 132 and the surface of the substrate 140 located in the process chamber 130 directly below the plenum 220. Directly below the substrate holder 132 is the gas outlet 136, same as in plasma system 100. Accordingly, the gas flows over the substrate 140 symmetrically outwards, around the periphery of the substrate 140, and exits the process chamber 130 through the gas outlet 136.

Because the bottom wall 222 of the plenum 220 has openings 227, the ability to block electromagnetic radiation emanating from the plasma in plasma system 200 may be diminished relative to plasma system 100. However, the openings 227 may be designed to maintain the blocking capability to be almost the same. For example, the width of the holes (the openings 227) in the bottom wall 222 may be designed to be narrow to provide a high aspect ratio. The high aspect ratio would greatly reduce the total solid angle for which substrate 140 remains exposed to ultraviolet radiation in the direct line of sight of the plasma, such that, for example, less than 1% of the ultraviolet radiation energy emitted by the plasma in the radical source chamber may reach the substrate 140.

Figure 3A:
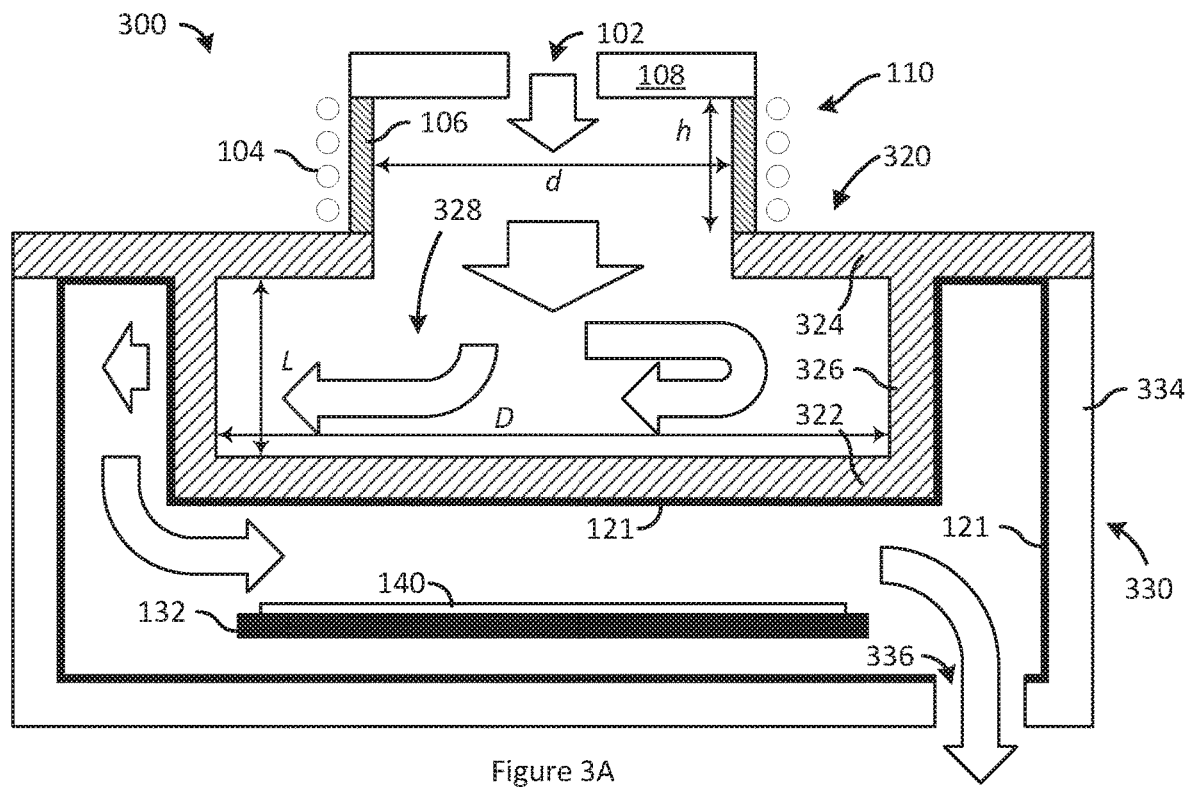
FIG. 3A illustrates a cross-sectional view of a plasma system for chemically processing a surface of a substrate, in accordance with an embodiment.
Figure 3B:
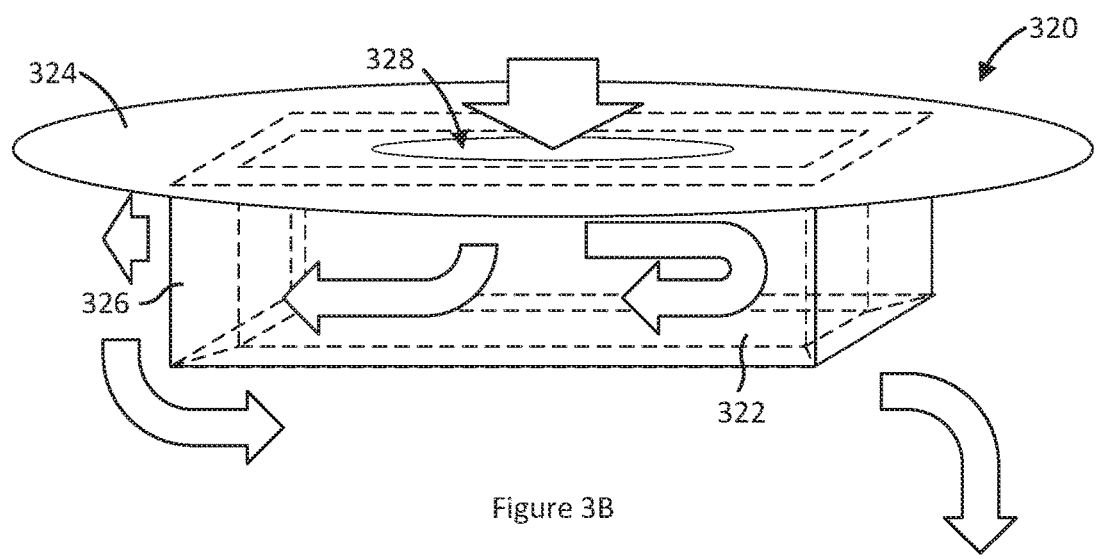
FIG. 3B illustrates a perspective view of a section of the plasma system illustrated in cross-sectional view in FIG. 2A, in accordance with an embodiment.

FIGS. 3A-3B illustrate a plasma system 300 with asymmetric gas flow generated by an asymmetric configuration of openings in the walls of the plasma system 300. One difference between the plasma system 100 and the plasma system 300 is that, in plasma system 300, the gas flow through the radical ballast region 328 into the process chamber 130 is directed asymmetrically towards one side (e.g., the left side in FIGS. 3A-3B) of the plenum 320 and, upon exiting the plenum 320, the gas flows over the substrate holder 132 (and substrate 140) in a cross flow to the opposite side (e.g., the right side in FIGS. 3A-3B) of the plenum 320 inside the process chamber 330, as indicated by the block arrows in FIGS. 3A-3B.

In the example illustrated in Figures 3A-3B, a one-directional linear flow is desired in the radical ballast region 328. In order to generate such a flow pattern, it may be preferable to use a rectangular inverted hat shape for the plenum 320. As shown in the perspective view in FIG. 3B, the radical ballast region 328 may be designed to extend laterally between four rectangular vertical sides of a sidewall 326, and extend vertically from the rim 324 downwards to a rectangular bottom wall 322. The shape of the rim 324 may remain the same as in the rim 124 of plasma system 100. The one-directional linear flow pattern may be generated by configuring the plenum 320 with openings in one rectangular side of sidewall 326, while the other three sides of the sidewall 326 and the rectangular bottom wall 322 of the plenum 320 are designed to be solid (without openings) to block gas flow. Since the openings in the sidewall 326 are asymmetrically located on one side, for example, the left side in FIG. 3, the gas flow inside the radical ballast region 328 is directed to the left side, as illustrated in FIG. 3. The gas flow pattern over the substrate 140 may be directed by configuring the process chamber 330 with a gas outlet 336 disposed on the right side of the plenum 320, which is the side opposite to the side where the openings in the sidewall 326 are located. The location of the substrate holder 132 in the process chamber 330 may be maintained directly below the plenum 320.

Figure 4:
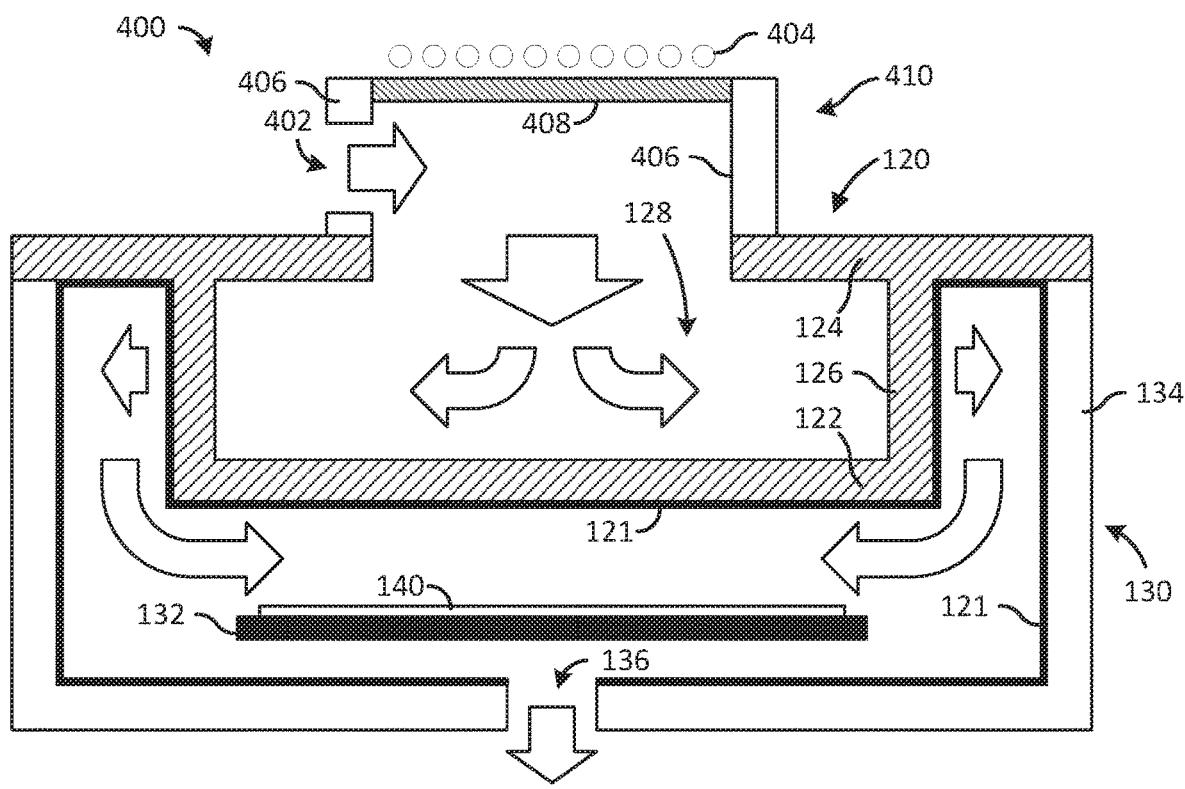
FIG. 4 illustrates a cross-sectional view of a plasma system for chemically processing a surface of a substrate, in accordance with an embodiment.

The radical source chambers in the plasma systems 100, 200, and 300 include an electrode 104 that may be configured as a helical resonator to couple RF power to the plasma. FIG. 4 illustrates a plasma system 400, where the radical source chamber 410 is equipped with an electrode 404 shaped like a planar coil. The electrode 404 may be coupled to an RF power source. As illustrated in FIG. 4, the electrode 404 is disposed over a dielectric (e.g., ceramic) top cover 408, and may be configured to supply RF power to the plasma by inductive coupling. The sidewall 406 of the radical source chamber 410 may comprise conductive material, such as aluminum or copper, and a gas inlet 402 may be located to introduce gases (e.g., argon, oxygen, sulfur hexafluoride, and tetrafluoromethane, nitrogen trifluoride, and the like).

Figure 5:
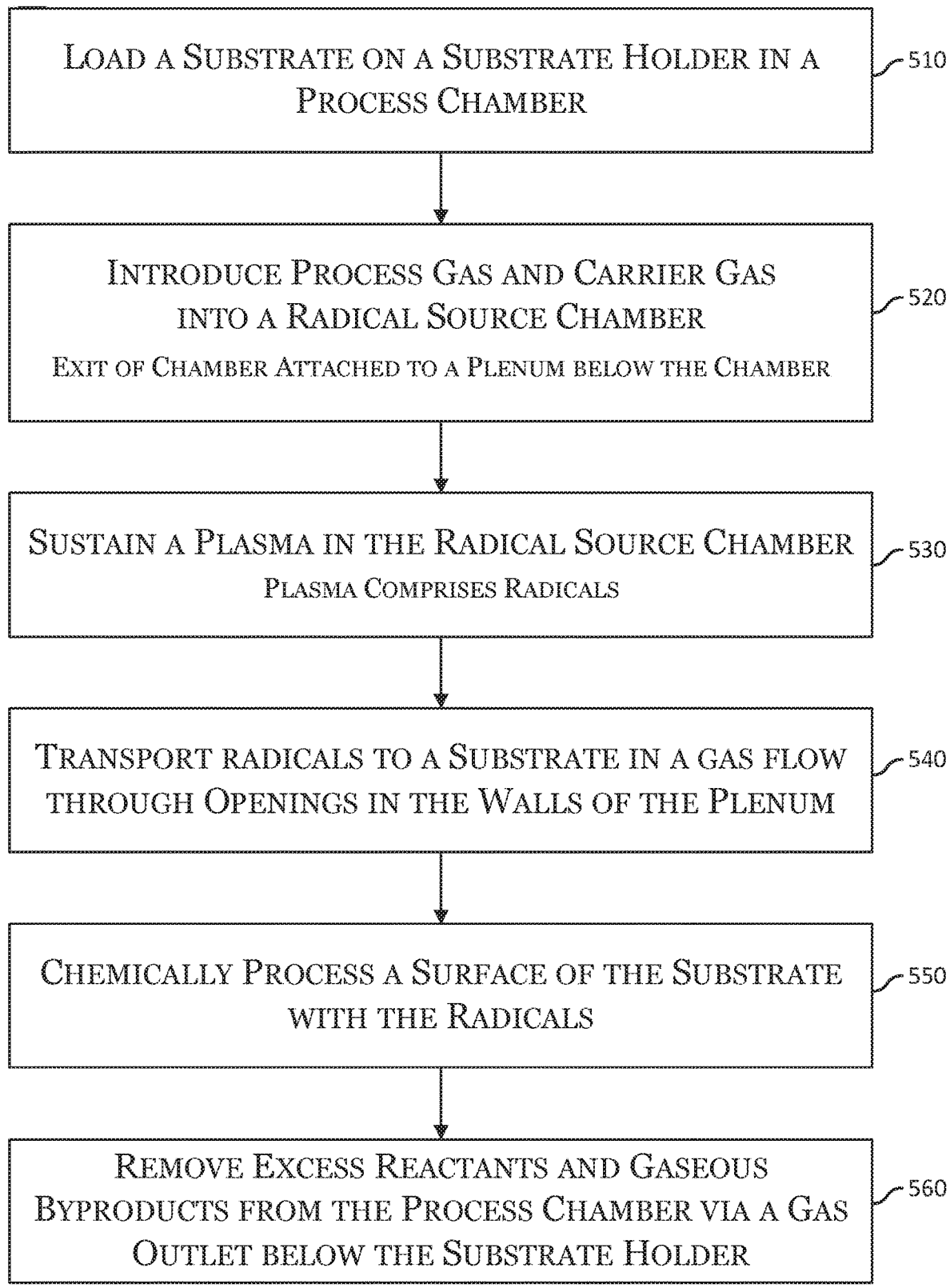
FIG. 5 is a flow diagram of a method for chemically processing a surface of a substrate, in accordance with an embodiment.

A flow diagram of the processing method is illustrated in FIG. 5. A substrate may be loaded on a substrate holder located inside a process chamber, for example, near the bottom of the process chamber, as indicated in block 510 in FIG. 5. In block 520, a gaseous mixture comprising process gas and carrier gas may be introduced into a radical source chamber disposed, for example, above the process chamber. The radical source chamber may have a bottom exit that is attached to a plenum comprising a radical ballast region. Plasma may be ignited and sustained in the radical source chamber, as indicated in block 530. The plasma may comprise radicals; hence be a source of radicals to be used downstream for chemically processing the surface of the substrate. The radicals exiting the radical source chamber into the plenum may be transported to the substrate in the process chamber through openings in the walls of the plenum, as indicated in block 540. The radicals may be moved in a gas flow over the substrate. In block 550, an exposed surface of the substrate may be chemically processed with the radicals. The gas flow may remove excess reactants and gaseous byproducts via a gas outlet of the process chamber, as indicated in block 560. The gas outlet may be located below the substrate holder.

Example embodiments of the invention are summarized here. Other embodiments can also be understood from the entirety of the specification as well as the claims filed herein.

Example 1. A plasma processing system including: a radical source chamber including a gas inlet, an electrode coupled to a radio frequency (RF) power source, where the electrode is configured to generate radicals within the radical source chamber, and an exit for radicals generated within the radical source chamber; a plenum attached to the exit of the radical source chamber, where the plenum is made of a first thermal conductor, and where the walls of the plenum include openings for gas flow; and a process chamber connected to the radical source chamber through the plenum, the process chamber including: a substrate holder disposed below the plenum; a gas outlet below the substrate holder; and process chamber walls including a second thermal conductor, where the process chamber walls of the process chamber are thermally coupled to the walls of the plenum.

Example 2. The system of example 1, where the first thermal conductor includes a material opaque to ultraviolet radiation.

Example 3. The system of one of examples 1 or 2, where the plenum is interposed between the radical source chamber and the substrate holder, and where the plenum is configured to block ultraviolet radiation emanating from within the radical source chamber in a direct line of sight from the radical source chamber to the substrate holder.

Example 4. The system of one of examples 1 to 3, where the first thermal conductor includes aluminum covered on one side with alumina or yttria.

Example 5. The system of one of examples 1 to 4, where the first thermal conductor and the second thermal conductor include the same thermal conductor.

Example 6. The system of one of examples 1 to 5, where the electrode is a conductor shaped like a planar coil disposed outside the radical source chamber over a top cover including a dielectric material.

Example 7. The system of one of examples 1 to 6, where the electrode is a conductor shaped like a helix disposed outside the radical source chamber around a cylindrical sidewall including a dielectric material, where the length of the conductor is a multiple of one quarter of the wavelength of an RF electromagnetic oscillation in the electrode powered by the RF power source.

Example 8. A plasma processing system including: a plenum including a bottom wall, a sidewall around the edge of the bottom wall, a rim extending outwards beyond the sidewall, and a radical ballast region between the sidewall and the bottom wall, where the plenum is a thermally conductive structure; a radical source chamber including a gas inlet, a radio frequency (RF) electrode, and a bottom exit attached to the rim of the plenum; a process chamber including thermally conductive walls that are physically attached to the plenum at the rim, where the plenum includes openings connecting the process chamber to the radical source chamber through the radical ballast region; and a substrate holder disposed below the bottom wall of the plenum.

Example 9. The system of example 8, where the plenum is shaped like an inverted hat with a rim shaped like a ring.

Example 10. The system of one of examples 8 or 9, where the width of the opening of the rim is less than or equal to the width of the exit of the radical ballast source, where the width of the radical ballast region is greater than or equal to the width of the exit of the radical ballast source, where the width of the radical ballast region is greater than or equal to the width of the substrate holder, where a depth of the radical ballast region is between 5 cm and 15 cm, and where a ratio of the width to the depth of the radical ballast region is between 3 and 10.

Example 11. The system of one of examples 8 to 10, where the openings are symmetrically located in the sidewall of the plenum, around an axis through the substrate holder.

Example 12. The system of one of examples 8 to 11 where the openings are asymmetrically located in the sidewall of the plenum, on one side of a mirror plane through the substrate holder.

Example 13. The system of one of examples 8 to 12, where the radical ballast region is shaped like a rectangular cavity, and where the openings are located in one of the four rectangular sides of the sidewall of the plenum.

Example 14. The system of one of examples 8 to 13, where the openings are located in the bottom wall of the plenum.

Example 15. The system of one of examples 8 to 14, where the openings in the bottom wall of the plenum are configured to limit ultraviolet radiation energy passing through the openings to less than 1% of the ultraviolet radiation energy incident on the top side of the bottom wall.

Example 16. The system of one of examples 8 to 15, further including a gas outlet disposed on only one side of the process chamber, the gas outlet being configured to direct the gas flow into a region of the process chamber adjacent to only one side of the plenum to generate a cross flow over the substrate holder.

Example 17. A plasma processing method including: loading a substrate on a substrate holder disposed near the bottom of a process chamber; via a gas inlet, introducing process gas and carrier gas into a radical source chamber, the radical source chamber including an exit attached to a plenum disposed below the radical source chamber; sustaining a plasma in a radical source chamber, the plasma including radicals; transporting the radicals to the substrate in a gas flow through openings in the walls of the plenum; chemically processing a surface of the substrate with the radicals; and removing excess reactants and gaseous byproducts from the process chamber via a gas outlet disposed below the substrate holder.

Example 18. The method of example 17, where the transporting includes directing the gas flow symmetrically through sidewalls of the plenum around an axis through the substrate holder.

Example 19. The method of one of examples 17 or 18, where the transporting includes directing the gas flow through sidewalls of the plenum on only one side of the plenum.

Example 20. The method of one of examples 17 to 19, further including generating a cross flow of the radicals above the substrate.

Various embodiments of a plasma system and method for chemically processing the surface of a substrate have been described above. The described embodiments provide several advantages, including low radical loss and increased radical to ion ratio, reduced or eliminated plasma-induced radiation damage, and efficient heat dissipation providing a stable temperature during processing. The plasma systems may have many design variations, some of which have been described in this disclosure. However, it is understood that many other variations may be derived from the described example embodiments by persons skilled in the art. For example, RF power may be provided by capacitive coupling or a microwave source; the openings for gas flow in the plenum may have different shapes, for example, a two-dimensional array of circular holes or rectangular holes; the geometrical design of the thermal conductors could be altered, and different dimensions and materials used in designing the structure of the plasma system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma processing system comprising:
   a radical source chamber comprising a gas inlet, an electrode coupled to a radio frequency (RF) power source, wherein the electrode is configured to generate radicals within the radical source chamber, and an exit for radicals generated within the radical source chamber;
   a plenum attached to the exit of the radical source chamber,
      wherein the plenum is made of a first thermal conductor, and
      wherein walls of the plenum comprise openings for gas flow; and
   a process chamber connected to the radical source chamber through the plenum, the process chamber comprising:
      a substrate holder disposed below the plenum;
      a gas outlet below the substrate holder; and
      process chamber walls comprising a second thermal conductor, wherein the process chamber walls of the process chamber are thermally coupled to the walls of the plenum, wherein the plenum is configured to block ultraviolet radiation emanating from within the radical source chamber in a direct line of sight from the radical source chamber to the substrate holder.

2. The system of claim 1, wherein the first thermal conductor comprises a material opaque to ultraviolet radiation, and wherein the plenum is interposed between the radical source chamber and the substrate holder.

3. The system of claim 1, wherein the first thermal conductor comprises aluminum covered on one side with alumina or yttria.

4. The system of claim 1, wherein the first thermal conductor and the second thermal conductor comprise the same thermal conductor.

5. The system of claim 1, wherein the electrode is a conductor shaped like a planar coil disposed outside the radical source chamber over a top cover comprising a dielectric material.

6. The system of claim 1, wherein the electrode is a conductor shaped like a helix disposed outside the radical source chamber around a cylindrical sidewall comprising a dielectric material, wherein the length of the conductor is a multiple of one quarter of the wavelength of an RF electromagnetic oscillation in the electrode powered by the RF power source.

7. A plasma processing system comprising:
   a monolithic structure comprising a plenum comprising a bottom wall, a sidewall around an edge of the bottom wall, a rim extending outwards beyond the sidewall, and a radical ballast region between the sidewall and the bottom wall, wherein the plenum is a thermally conductive structure;
   a radical source chamber comprising a gas inlet, a radio frequency (RF) electrode, and a bottom exit attached to the rim of the plenum;
   a process chamber comprising thermally conductive walls that are physically attached to the plenum at the rim, wherein the plenum comprises openings which enable fluid flow between the process chamber and the radical source chamber by way of the radical ballast region; and
   a substrate holder disposed below the bottom wall of the plenum.

8. The system of claim 7, wherein the plenum is shaped like an inverted hat with a rim shaped like a ring.

9. The system of claim 7,
wherein the width of the opening of the rim is less than or equal to the width of the radical source chamber,
wherein the width of the radical ballast region is greater than or equal to the width of the opening of the rim,
wherein the width of the radical ballast region is greater than or equal to the width of the substrate holder,
wherein a depth of the radical ballast region is between 5 cm and 15 cm, and
wherein a ratio of the width to the depth of the radical ballast region is between 3 and 10.

10. The system of claim 7, wherein the openings are symmetrically located in the sidewall of the plenum, around an axis through the substrate holder.

11. The system of claim 7 wherein the openings are asymmetrically located in the sidewall of the plenum, on one side of a mirror plane through the substrate holder.

12. The system of claim 11, wherein the radical ballast region is shaped like a rectangular cavity, and wherein the openings are located in one of four rectangular sides of the sidewall of the plenum.

13. The system of claim 7, wherein the openings are located in the bottom wall of the plenum.

14. The system of claim 13, wherein the openings in the bottom wall of the plenum are configured to limit ultraviolet radiation energy passing through the openings to less than 1% of the ultraviolet radiation energy incident on a top side of the bottom wall.

15. The system of claim 7, further comprising a gas outlet disposed on only one side of the process chamber, the gas outlet being configured to direct the gas flow into a region of the process chamber adjacent to only one side of the plenum to generate a cross flow over the substrate holder.

16. A plasma processing method comprising:
loading a substrate on a substrate holder disposed near a bottom of a process chamber;
via a gas inlet, introducing process gas and carrier gas into a radical source chamber, the radical source chamber comprising an exit attached to a plenum disposed below the radical source chamber, the plenum being formed of a monolithic structure and comprising a bottom wall, a sidewall around an edge of the bottom wall, a rim extending outwards beyond the sidewall, and a radical ballast region between the sidewall and the bottom wall;
sustaining a plasma in the radical source chamber, the plasma comprising radicals;
transporting the radicals to the substrate in a gas flow through openings in walls of the plenum, the walls comprising the sidewall and the bottom wall;
chemically processing a surface of the substrate with the radicals; and
removing excess reactants and gaseous byproducts from the process chamber via a gas outlet disposed below the substrate holder.

17. The method of claim 16, wherein the transporting comprises directing the gas flow symmetrically through sidewalls of the plenum around an axis through the substrate holder.

18. The method of claim 16, wherein the transporting comprises directing the gas flow through sidewalls of the plenum on only one side of the plenum.

19. The method of claim 18, further comprising generating a cross flow of the radicals from one side of the process chamber to another side above the substrate.

20. The method of claim 16, further comprising blocking ultraviolet radiation emanating from within the radical source chamber in a direct line of sight from the radical source chamber to the substrate holder while chemically processing the substrate.

* * * * *